(12) United States Patent  
Ma et al.

(10) Patent No.: US 8,866,154 B2  
(45) Date of Patent: Oct. 21, 2014

(54) LATTICE MISMATCHED HETEROJUNCTION STRUCTURES AND DEVICES MADE THEREFROM

(71) Applicant: Wisconsin Alumni Research Foundation, Madison, WI (US)

(72) Inventors: Zhenqiang Ma, Middleton, WI (US); Jung-Hun Seo, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 42 days.

(21) Appl. No.: 13/831,449

(22) Filed: Mar. 14, 2013

(65) Prior Publication Data

US 2014/0264375 A1    Sep. 18, 2014

(51) Int. Cl.
*H01L 29/15*    (2006.01)
*H01L 29/06*    (2006.01)
*H01L 29/16*    (2006.01)

(52) U.S. Cl.
CPC ................................. *H01L 29/1602* (2013.01)
USPC ............................................. 257/77; 257/12

(58) Field of Classification Search
CPC ... H01L 21/20; H01L 21/8249; H01L 29/737; H01L 21/331; H01L 29/778; H01L 31/0328; H01L 21/8222; H01L 21/338
USPC ........ 257/77, 51, 12; 438/105, 931, 455–458; 136/243–265
See application file for complete search history.

(56) References Cited

U.S. PATENT DOCUMENTS

| | | | |
|---|---|---|---|
| 6,881,988 B2 | 4/2005 | Niwa et al. | |
| 7,030,428 B2 | 4/2006 | Saxler | |
| 7,354,809 B2 | 4/2008 | Yuan et al. | |
| 7,777,290 B2 | 8/2010 | Lagally et al. | |
| 8,217,410 B2 | 7/2012 | Ma et al. | |
| 8,232,617 B2 | 7/2012 | Ma et al. | |
| 2003/0032253 A1* | 2/2003 | Nguyen et al. | 438/317 |
| 2003/0136956 A1* | 7/2003 | Niwa et al. | 257/12 |
| 2004/0164319 A1* | 8/2004 | Zampardi et al. | 257/196 |
| 2005/0218428 A1* | 10/2005 | Bahl et al. | 257/197 |
| 2006/0121682 A1* | 6/2006 | Saxler | 438/312 |

FOREIGN PATENT DOCUMENTS

| | | |
|---|---|---|
| JP | 2005-512327 | 4/2005 |
| KR | 10-2003-0063075 | 7/2003 |

OTHER PUBLICATIONS

Gui et al., The effect of surface roughness on direct wafer bonding, Journal of Applied Physics, vol. 85, No. 10, May 15, 1999, pp. 7448-7454.
Chen et al., Epitaxially oriented growth of diamond on silicon by hot filament chemical vapor deposition, Appl. Phys. Lett., vol. 68, No. 2, Jan. 8, 1996, pp. 176-178.

(Continued)

*Primary Examiner* — Julio J Maldonado
*Assistant Examiner* — Sheikh Maruf
(74) *Attorney, Agent, or Firm* — Bell & Manning, LLC

(57) ABSTRACT

Semiconductor heterojunction structures comprising lattice mismatched, single-crystalline semiconductor materials and methods of fabricating the heterojunction structures are provided. The heterojunction structures comprise at least one three-layer junction comprising two layers of single-crystalline semiconductor and a current tunneling layer sandwiched between and separating the two layers of single-crystalline semiconductor material. Also provided are devices incorporating the heterojunction structures, methods of making the devices and method of using the devices.

22 Claims, 16 Drawing Sheets

(56) References Cited

OTHER PUBLICATIONS

Barnett et al., 50% Efficient Solar Cell Architectures and Designs, Conference Record of the 2006 IEEE 4th World Conference on Photovoltaic Energy Conversion, Waikoloa, HI, May 7-12, 2006, pp. 2560-2564.

International Search Report and Written Opinion issued in PCT/US2014/011569, May 20, 2014.

* cited by examiner

| Material | Layer | Dopant Concentration | Thickness |
|---|---|---|---|
| n+ GaAs | Contact | Si, $10^{19}$ cm$^{-3}$ | 200 nm |
| n- GaAs | Emitter | Si, $3 \times 10^{17}$ cm$^{-3}$ | 35 nm |
| Al$_2$O$_3$ | Current Tunneling | ALD deposited | 1 nm |
| p+ Si | Base | Boron, $10^{20}$ cm$^{-3}$ | 50 nm |
| Al$_2$O$_3$ | Current Tunneling | ALD deposited | 2 nm |
| n GaAs | Collector | Si, $1 \times 10^{16}$ cm$^{-3}$ | 800 nm |
| n GaAs | Collector | Si, $5 \times 10^{16}$ cm$^{-3}$ | 200 nm |
| n+ GaAs | Sub-Collector | Si, $5 \times 10^{18}$ cm$^{-3}$ | 900 nm |

FIG. 4

| Material | Layer | Thickness |
|---|---|---|
| p+ Si | Contact | 200 nm |
| p Si | Emitter | 50 nm |
| $Al_2O_3$ | Current Tunneling | 1 nm |
| n+ Ge | Base | 50 nm |
| $Al_2O_3$ | Current Tunneling | 2 nm |
| p- diamond | Collector | 1000 nm |
| p+ diamond | Sub-Collector | 500 nm |

FIG. 5

| Emitter | Base | Collector |
|---|---|---|
| Si | Si | GaN |
| GaAs | Si | GaN |
| GaAs | Ge | GaN |
| Si | Ge | GaN |
| GaN | Si | GaN |
| GaN | Ge | GaN |
| InAlAs | Si | GaN |
| InP | Ge | GaN |
| Si | Si | SiC |
| GaAs | Si | SiC |
| GaAs | Ge | SiC |
| Si | Ge | SiC |
| GaN | Si | SiC |
| GaN | Ge | SiC |
| InAlAs | Si | SiC |
| InP | Ge | SiC |

FIG. 6

| Emitter | Base | Collector |
|---|---|---|
| GaAs | Si | GaAs |
| GaAs | Ge | GaAs |
| GaInP | Si | GaInP |
| GaInP | Ge | GaInP |
| AlGaAs | Si | AlGaAs |
| AlGaAs | Ge | AlGaAs |
| GaAs | Si | InP |
| GaAs | Ge | InP |
| GaAs | Si | InAlAs |
| GaAs | Ge | InAlAs |

| Material | Layer | Thickness |
|---|---|---|
| p+ Si | Emitter | 200 nm |
| n Si | Base | 50 nm |
| Al$_2$O$_3$ | Current Tunneling | 2 nm |
| p- diamond | Collector | 1000 nm |
| p+ diamond | Sub-Collector | 500 nm |

(B)

| Emitter | Base | Collector |
|---|---|---|
| Si | Ge | Diamond |
| GaAs | Si | Diamond |
| GaInP | GaAs | Diamond |
| GaInP | InGaAs | Diamond |
| InAlAs | InGaAs | Diamond |

| p | i | n |
|---|---|---|
| Si | InGaAs | Si |
| GaAs | InGaAs | GaAs |
| Diamond | GaN | GaN |
| Diamond | AlGaN | AlGaN |
| Diamond | ZnO | ZnO |
| Si | InGaAsP | Si |
| Diamond | GaInN | GaN |
| Diamond | GaN | AlGaN |
| Diamond | GaInN | AlGaN |

FIG. 11(B)

| nip | nip | nip |
|---|---|---|
| GaInP | GaAs | Ge |

| nip | nip | nip | nip | nip | nip |
|---|---|---|---|---|---|
| AlP | GaInP | GaAs | Si | SiGe | Ge |

FIG. 12

| p | i | p | i |
|---|---|---|---|
| Ge | Ge | Si | Si |
| Si | Si | GaAs | GaAs |
| Ge | Ge | GaAs | GaAs |

| Layer # | Layer material | Doping (cm$^{-3}$) | Thickness (Å) |
|---|---|---|---|
| 1 | n+ In$_y$Ga$_{1-y}$As (y=0.6) | 1e19 | 500 |
| 2 | n+ In$_y$Ga$_{1-y}$As (y=0.6 to 0) | 1e19 | 500 |
| 3 | n+ GaAs | Si:5e18 | 1200 |
| 4 | n InGaP | Si:3e17 | 400 |
| 5 | p+ GaAs | C:4e19 | 1370 |
| 6 | n- GaAs | Si:1e16 | 8000 |
| 7 | n- GaAs | Si:5e16 | 2000 |
| 8 | n+ GaAs | Si:5e18 | 9000 |
| 9 | GaAs | undoped | 500 |

FIG. 13

| Layer Number | Material | Dopant Concentration (cm$^{-3}$) | Layer | Thickness |
|---|---|---|---|---|
| 4 | GaAs | N (Si, 1x10$^{19}$) | contact | 200 nm |
| 3 | GaAs | N (Si, 1x10$^{17}$) | Emitter | 35 nm |
| 2 | Al$_{0.95}$Ga$_{0.05}$As | | Sacrificial release layer | 150 nm |
| 1 | GaAs | | Smoothing layer | 50 nm |

FIG. 16

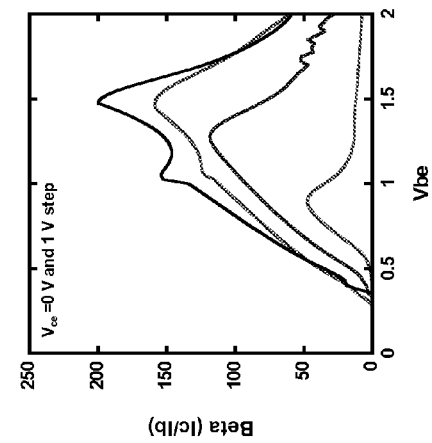
FIG. 17A
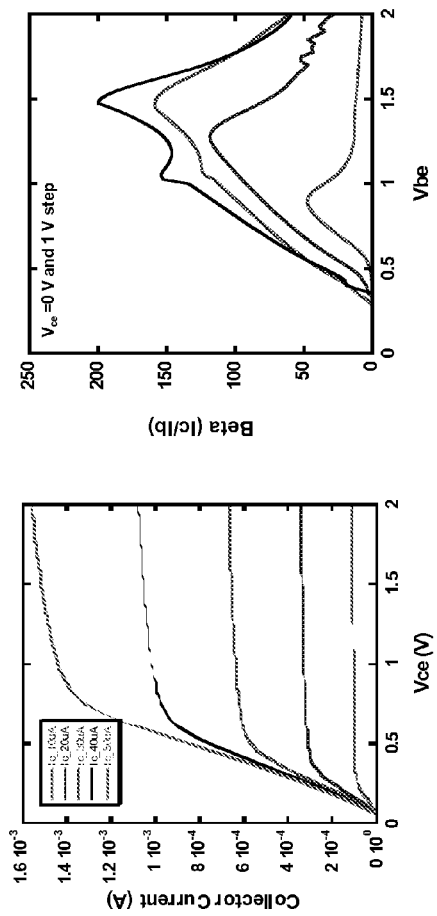
FIG. 17B
FIG. 17C
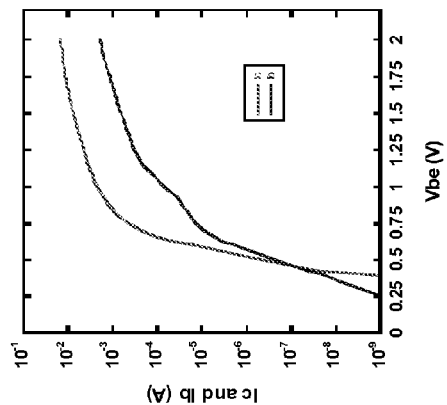
FIG. 17E
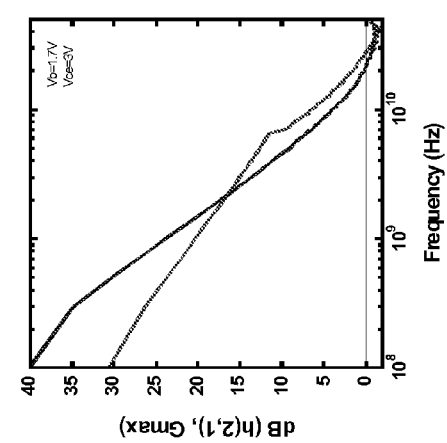
FIG. 17D
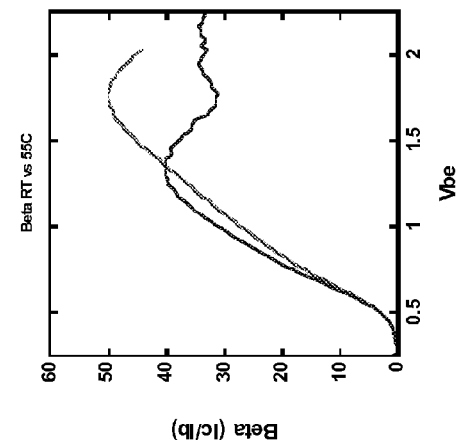

LATTICE MISMATCHED HETEROJUNCTION STRUCTURES AND DEVICES MADE THEREFROM

REFERENCE TO GOVERNMENT RIGHTS

This invention was made with government support under FA9550-09-1-0482 and FA9550-08-1-0337 awarded by the USAF/AFOSR, N00014-12-1-0077, N00014-12-1-0884 and N00014-13-1-0226 awarded by the NAVY/ONR, and W911NF-11-1-0415 awarded by the ARMY/ARO. The government has certain rights in the invention.

BACKGROUND

Semiconductor heterojunctions and devices incorporating them are key components of the semiconductor industry. Conventional heterojunctions are formed by epitaxial growth of materials that are lattice matched, or nearly lattice matched, with their growth substrate. Thus, epitaxial growth techniques require that the material being grown take on the same structure and crystalline orientation as the growth substrate. A large lattice mismatch between the materials in successive layers in an epitaxially-grown heterostructure will result in dislocation formation, leading to failed devices.

Wafer bonding is another technique that has been used to fabricate heterostructures of dissimilar materials. However, conventional wafer bonding requires that the bonded surfaces be atomically smooth in order to avoid the formation of voids at the interface and further requires that the materials to be bonded have similar coefficients of thermal expansion in order to render them compatible with the high temperatures used during the bonding process. Moreover, an interface layer formed between two dissimilar materials by wafer bonding is typically characterized by defects and damaged atomic lattices of the bonded materials, as a result of chemical interactions. As a result, such heterostructures find limited use.

Unfortunately, these drawbacks of epitaxial growth and wafer bonding techniques have limited the number of material combinations that can be incorporated into semiconductor heterojunction structures.

SUMMARY

Semiconductor heterojunction structures comprising lattice mismatched, single-crystalline semiconductor materials and methods of fabricating the heterojunction structures are provided. Also provided are devices incorporating the heterojunction structures, methods of making the devices and method of using the devices.

One embodiment of a semiconductor heterojunction structure comprises: (a) a layer of a first single-crystalline semiconductor material; (b) a layer of a second single-crystalline semiconductor material, the second single-crystalline semiconductor material having a different chemical composition and a different lattice constant than the first single-crystalline semiconductor material; (c) and a current tunneling layer disposed between and in contact with the upper surface of the layer of the first single-crystalline semiconductor material and the lower surface of the layer of the second single-crystalline semiconductor material. The current tunneling layer comprises an inorganic material. The bandgap of the inorganic material is wider that the bandgaps of the first and second single-crystalline semiconductor materials and the inorganic material is not a native oxide of the first single-crystalline semiconductor material or a native oxide of the second single-crystalline semiconductor material. The structures are characterized in that the interfaces between the current tunneling layer and the layers of the first and second single-crystalline semiconductor materials do not have an epitaxial structure.

An embodiment of a method for making a semiconductor heterojunction structure of the type described above, comprises the steps of depositing the current tunneling layer on the layer of the first single-crystalline semiconductor material and transferring the layer of the second single-crystalline material onto the current tunneling layer.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 4 is a table listing the material, layer type, dopant type and concentration, and thickness of each layer in one embodiment of the HBT of FIG. 3.

FIG. 5 is a table listing the material, layer type, dopant type and concentration, and thickness of each layer in another embodiment of the HBT of FIG. 3.

FIG. 6 is a table listing semiconductor material combinations that can be employed as the emitter, base and collector materials of wide-bandgap-collector HBT.

FIG. 7 is a table listing semiconductor material combinations that can be employed as the emitter, base and collector materials of a Group III-V collector HBT.

FIG. 9(A) is a table listing the material, layer type and thickness of each layer in an embodiment of the HBT of FIG. 8. FIG. 9(B) is a table listing the material, layer type, and thickness of each layer in embodiments of the HBTs having diamond collectors.

FIGS. 11 (A) and (B) are tables listing semiconductor material combinations that can be employed as the layers of single-crystalline semiconductor material to provide heterostructures having a pin-type energy band structure.

FIG. 12 is a table listing semiconductor material combinations that can be employed as the layers of single-crystalline semiconductor material to provide heterostructures having a pipi-type energy band structure.

FIG. 13 is a table listing the material, dopant concentration and type, and thickness for each layer in the original heterostructure from which the collector layer of the HBT in the Example was fabricated.

FIG. 16 is a table listing the material, layer type, dopant concentration and type, and thickness for each layer in the original heterostructure from which the emitter layer of the HBT in the Example was fabricated.

DETAILED DESCRIPTION

Figure 1:
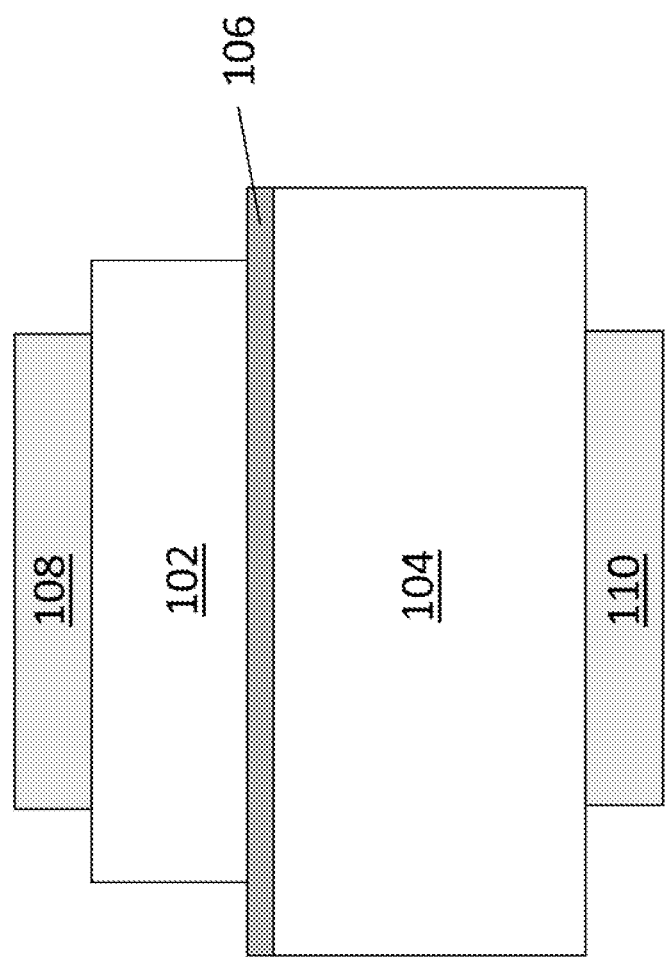
FIG. 1 is a schematic diagram showing a cross-sectional view of a PN junction diode comprising two layers of dissimilar single-crystalline semiconductor materials separated by a current tunneling layer.
Figure 2:
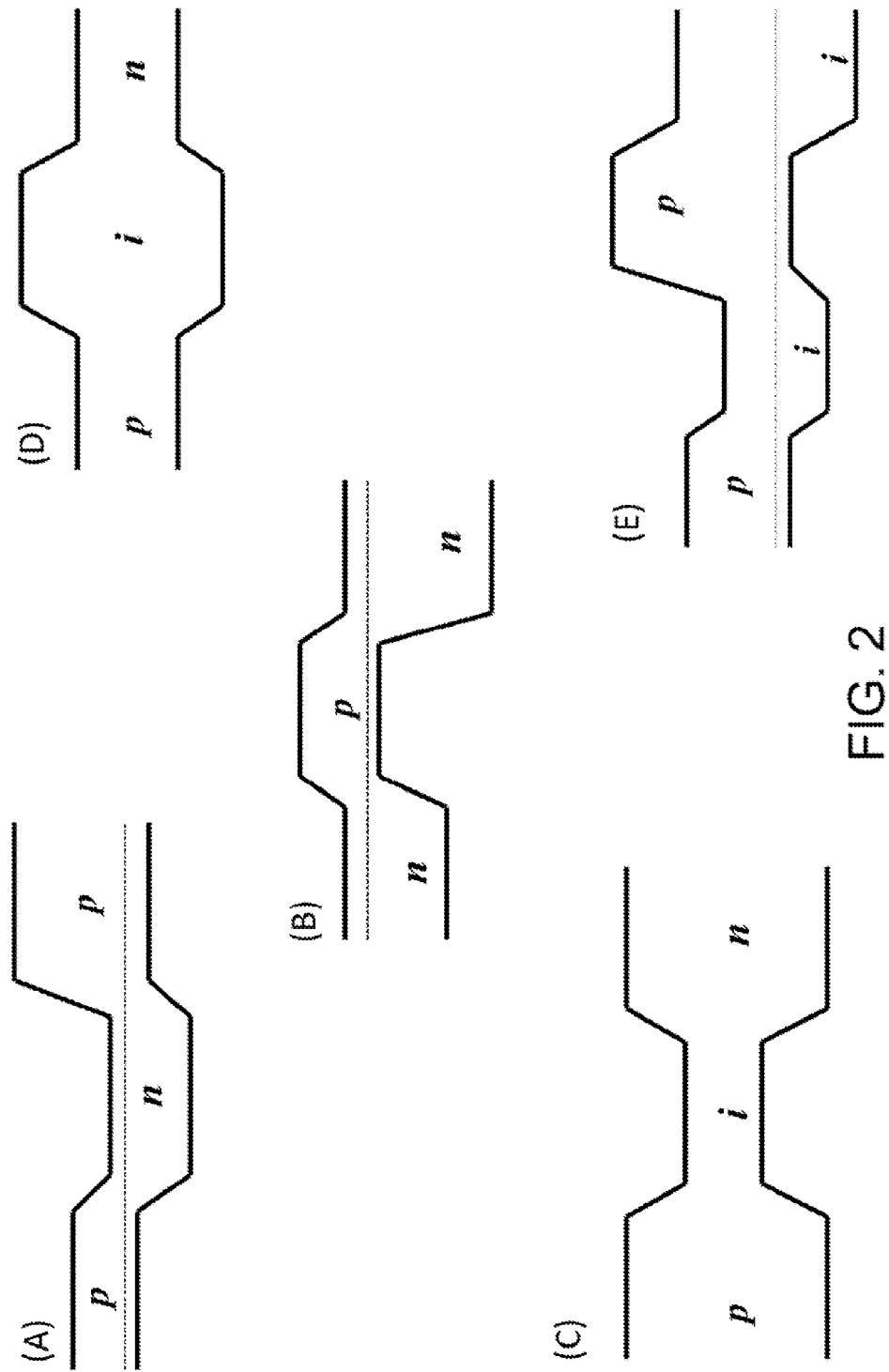
FIGS. 2(A)-(E) are schematic illustrations of pnp-type (A), npn-type (B) pin-type (C) and (D) and pipi-type (E) electronic energy band structures that can be provided by the present heterojunction structures.

Semiconductor heterojunction structures comprising lattice mismatched, single-crystalline semiconductor materials and methods of fabricating the heterojunction structures are provided. The heterojunction structures comprise at least one three-layer junction comprising two layers of single-crystalline semiconductor and a current tunneling layer sandwiched between and separating the two layers of single-crystalline semiconductor material. Also provided are devices incorporating the heterojunction structures, methods of making the devices and method of using the devices.

The semiconductor heterojunctions in the structures are fabricated using nanomembrane (i.e., films having nano-scale thicknesses—i.e., thicknesses less than about 2000 nm) transfer techniques and, therefore, do not rely upon epitaxial growth or wafer bonding processes. This is advantageous because it eliminates the requirement that the materials in the various layers of the heterojunction structures be lattice matched—or nearly so. In addition, unlike wafer bonding techniques, the present methods do not require atomically smooth surfaces for bonding and can tolerate relatively large differences in the coefficients of thermal expansion for the semiconductor materials in the heterojunction stack. Finally, because the two single-crystalline semiconductor materials are physically separated from each other by a current tunneling layer, chemical reactions between the two materials may be avoided and the surfaces of the two materials may be passivated. As a result, the present semiconductor heterojunctions can be fabricated from a much wider range of semiconductor materials than those made from epitaxial growth or wafer bonding techniques.

In one embodiment, a semiconductor heterostructure comprises a layer of a first single-crystalline semiconductor material; a layer of a second single-crystalline semiconductor material; and a current tunneling layer disposed between and in contact with the upper surface of the layer of the first single-crystalline semiconductor material and the lower surface of the layer of the second single-crystalline semiconductor material. In this structure, the second single-crystalline semiconductor material has a different chemical composition and a different lattice constant than the first single-crystalline semiconductor material. The current tunneling layer comprises an inorganic material, such as an oxide or nitride of a metal or metalloid element. The inorganic material is characterized in that it has a bandgap that is wider than the bandgap of either of the two single-crystalline semiconductor materials that it separated and is further characterized by the ability to passivate surface states of the materials. In addition, the heterostructures are characterized in that the interfaces between the current tunneling layer and the layers of the first and second single-crystalline semiconductor materials do not have an epitaxial structure.

The single-crystalline semiconductor materials are inorganic semiconductors. The semiconductor materials in neighboring layers (i.e., in layers separated by an intervening current tunneling layer) are dissimilar, such that there is a band offset in the electronic energy band diagram of the heterojunctions formed by the two materials. The semiconductor materials can be independently selected from a broad range of semiconductors including: (a) Group IV semiconductors; (b) Group III-V semiconductors; and (c) Group II-VI semiconductors. The semiconductor materials of neighboring layers may be selected from the same group or may be selected from different groups. For example, in an embodiment where the layer of first semiconductor material is a layer of a Group IV semiconductor, the layer of second semiconductor material can be a layer of a Group III-V or a Group II-VI semiconductor. Similarly, in an embodiment where the layer of first semiconductor material is a layer of a Group III-V semiconductor, the layer of second semiconductor material can be a layer of a Group IV or a Group II-VI semiconductor. The Group IV semiconductors include all elemental semiconductors (e.g., Si, Ge and C, including diamond), as well as alloy and compound semiconductors (e.g., SiGe:C, SiGe, SiGeSn and SiC). The Group III-V and Group II-VI semiconductors include binary, ternary and higher compound semiconductors. Examples of Group III-V semiconductors include GaAs, AlGaAs, InGaAs, AlAs, InAlAs, InP, GaInP, GaP, GaN, InGaN, InAlN and AlGaN. Examples of Group II-VI semiconductors include oxides, such as ZnO. In some embodiments the semiconductor materials are undoped, while in others they are doped to render them semiconducting or to enhance their semiconducting properties. The doping may be p-type or n-type depending upon the material and the intended application for the heterojunction structure.

Each layer of semiconductor material can be characterized by an upper surface, a lower surface and a circumferential edge surface. (The terms "upper" and "lower" are not used to designate any absolute orientation. Rather they are merely intended to refer to the oppositely facing surfaces that run parallel to (including substantially parallel to) a plane laterally bisecting the layer.) In some embodiments, the root mean square (rms) roughness of the upper and/or lower surfaces may be significantly higher than would be considered acceptable for void-free wafer bonding. Thus, in some embodiments, the upper and/or lower surfaces have an rms roughness of greater than 1 nm. This includes embodiments in which the upper and/or lower surfaces have an rms roughness of at least 2 nm (e.g., in the range from 2 nm to 10 nm) and further includes embodiments in which the upper and/or lower surfaces have an rms roughness of at least 5 nm (e.g., in the range from 5 nm to 10 nm). For the purposes of determining the rms roughness of a surface, it can be determined from an AFM image over the area of the interface between the layer of single-crystalline semiconductor material and the current tunneling layer.

As used herein, the term "current tunneling layer" refers to a layer characterized in that it is made from an appropriate material and is sufficiently thin that it is able to act as a tunneling layer for electrons and holes. That is, unlike a typical dielectric medium, it allows both electrons and hole to pass through it, from the first layer to the second layer of single-crystalline semiconductor material, via quantum tunneling. Thus, because metals would block the passage of holes, metals are not suitable materials for a current tunneling layer. However, a wide range of non-metal inorganic materials can meet these criteria. The inorganic material of the current tunneling layer may be a material that would act as a dielectric in its bulk form, but is sufficiently thin that it no longer acts as an electrical insulator. The current tunneling layer provides a sort of 'glue' between the layers of single-crystalline semiconductor material. It is able to conform to the topography of the surfaces of the layers of semiconductor materials without introducing voids at the interfaces. Other advantages provided by this layer of inorganic material are that it can passivate the surfaces of the layers of semiconductor materials with which it is in contact, such that dangling bonds and interface states are minimized or eliminated, and it can prevent the interdiffusion of the semiconductor materials from the neighboring layers of single-crystalline semiconductor materials. This latter effect avoids the formation of an unwanted, intervening, cross-contaminated semiconductor interface layer between layers of single-crystalline semiconductor.

The thickness of the current tunneling layer typically need only be on the order of the rms roughness of the surfaces of the layers of the semiconductor materials which it binds. By way of illustration, in some embodiments, the current tunneling layer has a thickness in the range from about 1 to about 10 nm. This includes embodiments in which it has a thickness in the range from about 2 to about 10, from about 2 to about 5 nm or from about 1 to about 3 nm. Since the thickness of the current tunneling layer may not be uniform on an atomic scale, the thickness of the layer corresponds to the average thickness of the layer across the bonding interfaces of the heterojunction structure.

In some embodiments, the inorganic material of the current tunneling layer is an oxide. In such embodiments, the oxide can comprise, consist of, or consist essentially of, a metal oxide, an oxide of a semiconductor element or an oxide of a metalloid element. Examples of oxides that may be used in metal oxide current tunneling layers include, but are not limited to, those that can be deposited via atomic layer deposition (ALD). Examples of such metal oxides include aluminum oxide ($Al_2O_3$), titanium oxide ($TiO_2$), hafnium oxide ($HfO_2$) and tantalum oxide. $SiO_2$ is another example. In some embodiments, the metal, semiconductor or metalloid elements present in the oxide are different from any metal, semiconductor or metalloid elements in the single-crystalline semiconductor materials with which they are in contact and between which they are disposed. In the present heterostructures, the inorganic oxides of the current tunneling layers are not native oxides of either of the two single-crystalline semiconductor materials in the layers that they separate. Thus, in the embodiment described here, the inorganic oxide is not a native oxide of the first or second single-crystalline semiconductor materials. (As used herein, the term native oxide refers to an oxide that would be monolithically formed on the single-crystalline material as the result of the oxidation of the single-crystalline material in an oxygen-containing environment. For example, $SiO_2$ is a native oxide of Si.)

In other embodiments, the inorganic material of the current tunneling layer is a ntiride. In such embodiments, the nitride can comprise, consist of, or consist essentially of, a metal nitride, nitride of a semiconductor element or a nitride of a metalloid element. Examples of nitrides that may be used in nitride current tunneling layers include, but are not limited to, those that can be deposited via atomic layer deposition (ALD). Examples of such nitrides include aluminum nitride, silicon nitride, and titanium nitride. In some embodiments, the metal, semiconductor or metalloid elements present in the nitride are different from any metal, semiconductor or metalloid elements in the single-crystalline semiconductor materials with which they are in contact and between which they are disposed.

In some embodiments, the current tunneling layer comprises two or more sub-layers, each of which comprises an inorganic material, provided, however, that the total combined thickness of the sub-layers is still low enough to allow for the tunneling of electrons and holes through the layer. For example, in a current tunneling layer comprising multiple sub-layers comprising inorganic oxides, the inorganic oxides can be selected such that one oxide passivates one of the two neighboring semiconductor materials, while another oxide passivates the other of the two neighboring semiconductor materials.

As noted above, the various neighboring layers of the heterojunctions do not have an epitaxial structure. As used herein the term "epitaxial structure" refers to a structure in which the crystallographic orientation of an overlying layer is determined by (matches) that of its underlying layer, such that the two layers have the same crystallographic orientation, at least in the area of their interface. Such epitaxial structures may include strains and stresses at the interface, induced by a lattice mismatch between the two materials and may even include misfit dislocations. In contrast to such epitaxial structures, the layers in the present structures have crystallographic orientations that are independent from (e.g., different from) those of their neighboring layers. As such, the layers that do not have an epitaxial structure are free of lattice mismatch-induced strains or stresses and lattice mismatch-induced misfit dislocations. In addition, the present heterojunctions do not require the use of intermediate buffer layers comprising a compositionally graded layer, stepped layers or a layer of strain-relaxed material.

The thicknesses of the layers of single-crystalline semiconductor materials will depend on the intended application for the heterojunctions. However, by way of illustration, in some embodiments of the heterojunctions, some or all of the layers of single-crystalline material have thicknesses of no greater than about 1000 nm.

The semiconductor materials selected for the neighboring single-crystalline semiconductor materials in the heterojunctions may have a lattice constant mismatch that would render them unsuitable for epitaxial growth—even in the presence of an intermediate buffer layer. For example, in some embodiments the lattice constant mismatch between the semiconductor material of the first layer and the semiconductor material of the second layer is greater than about 4%, as in the case of a Si layer and a Ge layer. This includes embodiments in which the lattice constant mismatch between the semiconductor material of the first layer and the semiconductor material of the second layer is greater than about 15%, as in the case of a Si layer and a GaN layer. This further includes embodiments in which the lattice constant mismatch between the semiconductor material of the first layer and the semiconductor material of the second layer is greater than about 30%, as in the case of a Si layer and a diamond layer. Also included are embodiments in which the first and second single-crystalline semiconductor materials have lattice constant mismatches of at least about 5%, at least about 10%, at least about 20% and at least about 25%.

The semiconductor materials selected for the neighboring single-crystalline semiconductor materials in the heterojunction may have a coefficient of thermal expansion mismatch that would render them unsuitable for wafer bonding, which is typically carried out at very high temperatures. This is due, at least in part, to the presence of the current tunneling layer. The current tunneling layer can act as a buffer to the thermal expansion differences between the two single-crystalline semiconductor materials and can be used to bond the two single-crystalline semiconductor materials at processing temperatures lower than those used in wafer bonding processing techniques. By way of illustration, in some embodiments the coefficient of thermal expansion for the semiconductor material of one of two neighboring layers is at least twice that of the other layer. This includes embodiments in which the coefficient of thermal expansion for one of the two neighboring layers is at least three times that of the other layer and further includes embodiments in which the coefficient of thermal expansion for one of the two neighboring layers is at least five times that of the other layer.

The semiconductor heterojunction structures can be incorporated into a variety of electronic and optoelectronic devices. FIG. 1 is a schematic diagram showing a cross-sectional view of a PN junction diode that incorporates a heterojunction. The diode includes a layer of a first single-crystalline semiconductor material 102 (which may be, for example, p-type doped Si), a layer of a second single-crystalline semiconductor material 104 (which may be, for example, n-type doped GaAs) and a current tunneling layer 106 disposed between and in contact with the opposing surfaces of semiconductor material layers 102 and 104. A first electrode (ohmic contact) 108 is disposed on semiconductor material layer 102 and a second electrode 110 is disposed on semiconductor material layer 104. The device may further comprise a voltage source configured to apply an external voltage across electrodes 108 and 110.

The structure in FIG. 1 can be made by growing n-type doped GaAs on a semi-insulating GaAs substrate. A layer of $Al_2O_3$ having a thickness of, for example, 2 nm can then be deposited on top the n-type doped GaAs via ALD. A p-type doped Si layer, previously released from a ion implanted and annealed silicon-on-insulator wafer, can then be transferred onto the $Al_2O_3$, followed by a thermal anneal. Metal contacts can be deposited and patterned using photolithography and e-beam evaporation to form the heterostructure.

The PN junction diode of FIG. 1 is an example of a device incorporating a single three-layered heterojunction. Semiconductor heterostructures including more than one such heterojunction are also provided. This includes heterostructures comprising at least two such heterojunctions, at least 3 such heterojunctions, at least 10 such heterojunctions or at least 100 such heterojunctions. In such multiple heterojunction heterostructures the heterojunctions may be arranged in a vertical stack with the three-layered heterojunctions separated by one or more intervening layers of material—e.g. layers of dielectric materials, electrically conductive materials and/or semiconducting materials. Alternatively, the heterojunctions may be arranged in a back-to-back configuration, where a back-to-back configuration is one in which a central layer of single-crystalline material has a first neighboring layer of single-crystalline semiconductor material disposed above it and second neighboring layer of single-crystalline semiconductor material disposed below it, the first and second neighboring layers of single-crystalline semiconductor material being spaced from the central layer by a first and a second current tunneling layer, respectively. (The terms "above" and "below" are not used to designate any absolute orientation. Rather they are merely intended to refer to an arrangement in which the central layer of single-crystalline material is located between the first and second neighboring layers. Thus, the stacked structure may be disposed on its side, in which case the layers "above" and "below" would actually have a side-to-side configuration.) The back-to-back configuration can be extended over a plurality of the heterojunctions, with each additional layer of single-crystalline material between separated from its neighboring layer (or layers) of single-crystalline material by an additional current tunneling layer.

One embodiment of a double heterjunction structure having a back-to-back configuration comprises a layer of a first single-crystalline semiconductor material; a layer of a second single-crystalline semiconductor material; a layer of third single-crystalline material; a first current tunneling layer disposed between and in contact with the upper surface of the layer of the first single-crystalline semiconductor material and the lower surface of the layer of the second single-crystalline semiconductor material; and a second current tunneling layer that is either disposed between and in contact with the lower surface of the layer of the first single-crystalline semiconductor material and the upper surface of the layer of the third single-crystalline semiconductor material or disposed between and in contact with the upper surface of the layer of the second single-crystalline semiconductor material and the lower surface of the layer of the third single-crystalline semiconductor material. As previously discussed, in this structure, neighboring layers of single-crystalline semiconductor material have different chemical compositions and different lattice constants and the interfaces between the current tunneling layers and the layers of single-crystalline semiconductor materials do not have an epitaxial structure.

The electronic energy band structures for the back-to-back double heterojunction structures may have, for example, a pnp structure, an npn structure, a pin structure or a pip structure. FIG. 2(A) through 2(E) shows electronic energy band diagrams for each of these types of energy band structures. (Because the presence of the current tunneling layers does not materially change the band alignment for the neighboring semiconductor layers, the portions of the band structures corresponding to the current tunneling layers have been omitted from the figures for simplicity.)

Figure 3:
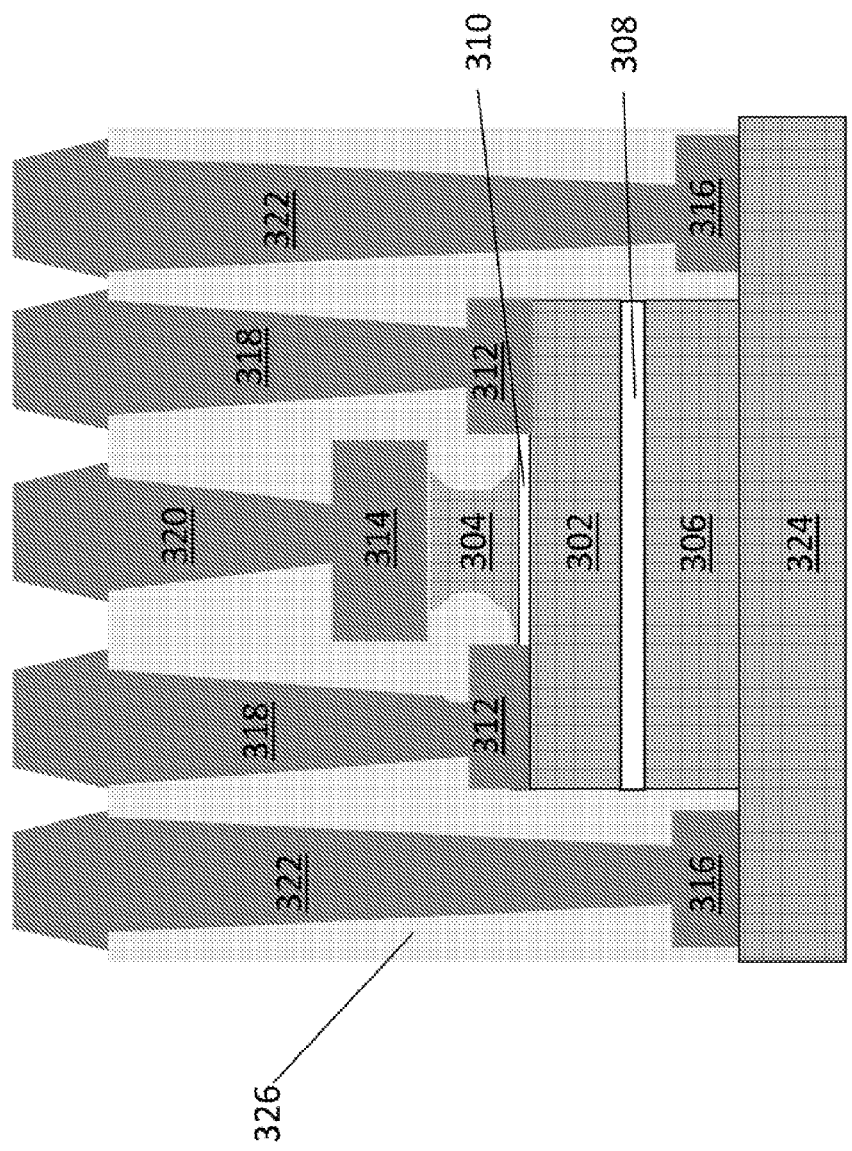
FIG. 3 is a schematic diagram showing a cross-sectional view of a vertical HBT comprising current tunneling layers between the collector and the base and between the base and the emitter.

Heterojunction bipolar transistors (HBTs) are examples of devices that can incorporate a back-to-back double heterojunction structure having either an npn or a pnp electronic energy band structure. FIG. 3 is a schematic illustration of a cross-sectional view of a vertical HBT. The device comprises a base 302 disposed between an emitter 304 and a collector 306, wherein base 302 is separated from collector 306 and from emitter 304 by a first 308 and a second 310 current tunneling layer, respectively. In the HBT, the emitter, base and collector each comprise a layer of single-crystalline semiconductor material, wherein the single-crystalline semiconductor material of the base has a different chemical composition and a different lattice constant than the single-crystalline semiconductor materials of the collector and the emitter. In addition, the interfaces between the current tunneling layers and the single-crystalline semiconductor materials of the emitter, base and collector do not have an epitaxial structure.

At least one base electrode (two are used in this embodiment) 312 is in electrical communication with base 302. At least one emitter electrode 314 is in electrical communication with emitter 304. At least one collector electrode (two are used in this embodiment) 316 is in electrical communication with collector 306. The device may further include electrically conductive base, emitter and collector interconnects 318, 320, 322 in electrical communication with base 302, emitter 304 and collector 306 and a sub-collector 324 underlying collector 306. The device components may be electrically isolated by a dielectric material 326 at least partially coating or encapsulating said components. FIG. 4 is a table illustrating suitable materials, dopant concentrations and layer thicknesses for each layer in one embodiment of an HBT having an npn type electronic energy band structure.

Included in the HBTs are those that employ diamond as one of the single-crystalline material layers. For example, the table in FIG. 5 illustrates suitable materials, dopant concentrations and layer thickness for each layer in an HBT having a pnp type electronic energy band structure that uses a layer of p-type doped diamond as a collector material. This HBT uses two different Group IV semiconductors (Ge and Si) as the base and emitter materials.

Different selections of materials can be used to provide other HBTs with both npn- and pnp-type electronic energy band structures. By way of illustration, FIG. 6 provides a table of single-crystalline semiconductor materials that can comprise the collector, base and emitter of an HBT with a wide-bandgap semiconductor material as a collector. FIG. 7 provides a table of single-crystalline semiconductor materials that can comprise the collector, base and emitter of an HBT having a Group III-V semiconductor as a collector.

Figure 8:
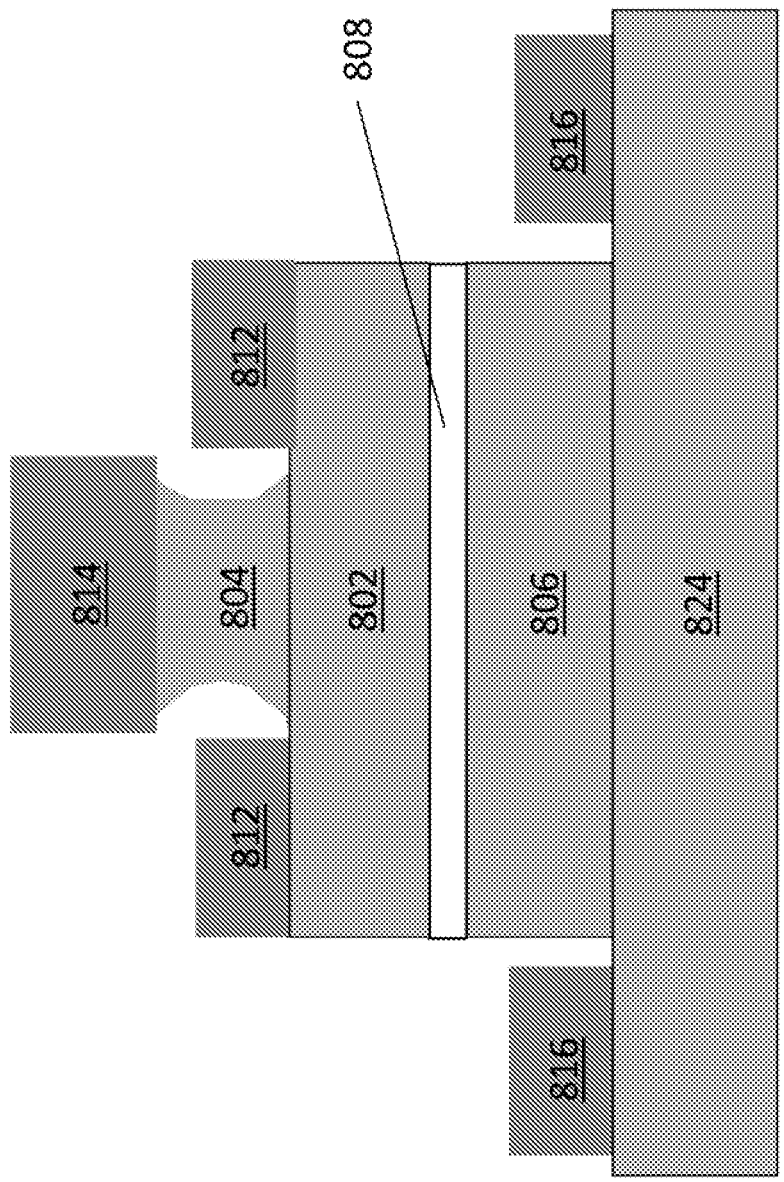
FIG. 8 is a schematic diagram showing a cross-sectional view of a vertical HBT having only a single current tunneling layer that is located between the collector and the base.
Figure 10:
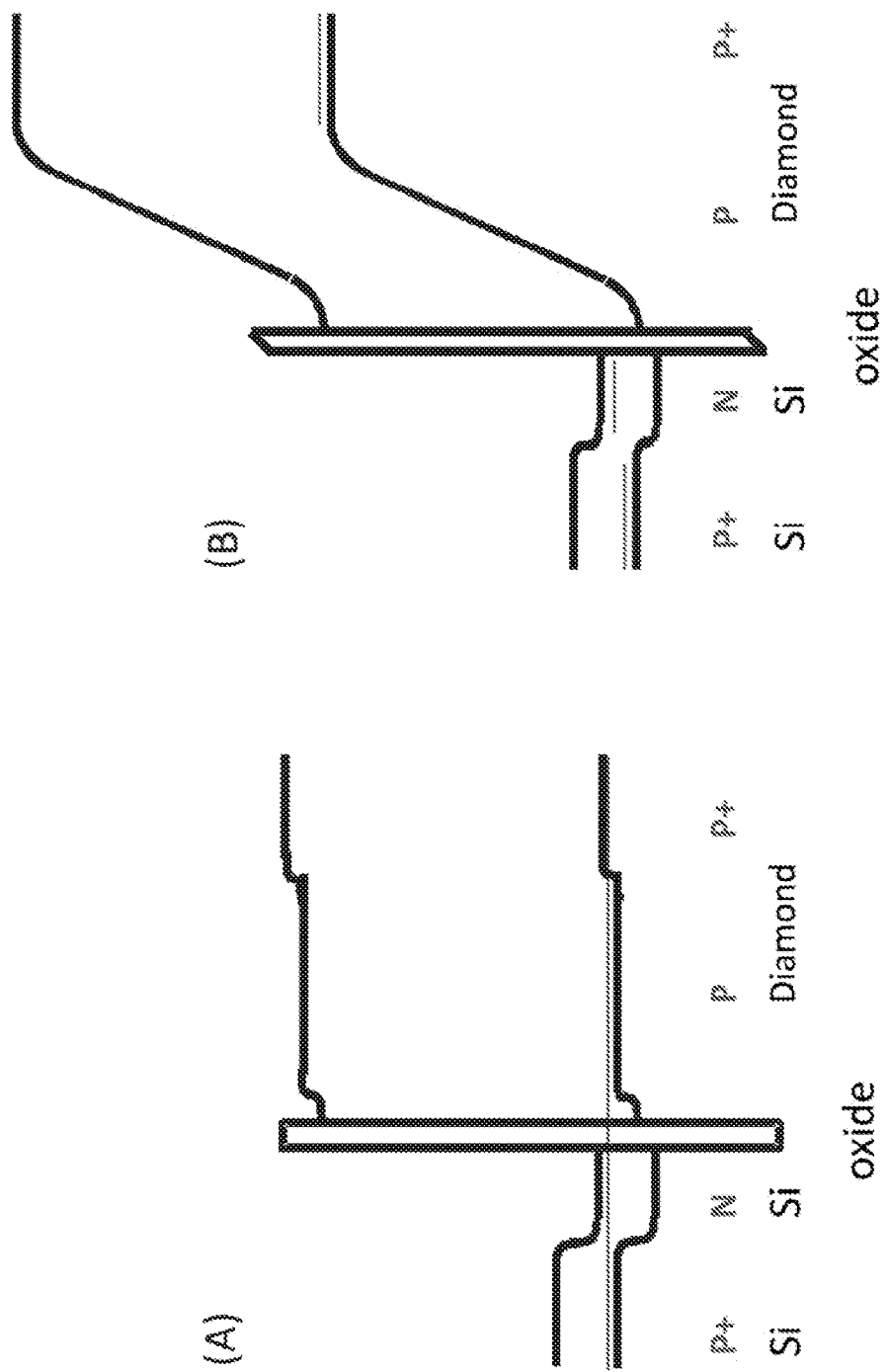
FIG. 10 is a diagram showing the scaled energy band structure of the heterojunction in the HBT of FIG. 8 at equilibrium (A) and under a forward bias (B).

In some embodiments of the present HBTs, only a single current tunneling layer is employed. This may be the case, for example, when two of the neighboring layers (e.g., the base and the collector or the base and the emitter) are comprised of semiconductor materials that are readily grown epitaxially, but the third layer comprises a material that does not lend itself to epitaxial growth on the other materials. FIG. 8 is a schematic illustration showing a cross-sectional view of one embodiment of such an HBT. (For simplicity, the vertical interconnects are omitted from the structure.) In the embodiment shown in FIG. 8, the base 802 is in direct contact with the overlying emitter 804. However, base 802 remains separated from the underlying collector 806 by current tunneling layer 808. As in the HBT depicted in FIG. 3, this HBT may include base, emitter and collector contacts 812, 814, 816 and a sub-collector 824. FIG. 9 is a table illustrating suitable materials, dopant concentrations and layer thicknesses for each layer in one embodiment of an HBT having a diamond collector and a pnp-type electronic energy band structure. FIG. 10 is a diagram showing the scaled energy band structure of the heterojunction at equilibrium (A) and under a forward bias (B).

The three-layered heterojunction structures can be usefully incorporated into a variety of other electronic and optoelectronic devices. Examples of devices comprising a heterostructure having a back-to-back heterojunction with a pin-type energy band structure include lasers, light-emitting diodes (LEDs), photodetectors, solar cells with tandem junctions, resonant tunneling diodes, and quantum cascade lasers. In these devices one or more of the single-crystalline semiconductor materials may be a photoactive material. That is, a material that is capable of absorbing radiant energy and converting it into electrical energy; capable of absorbing radiation of one wavelength and converting it into radiation of a different wavelength, or capable converting electrical energy into radiation. In such devices a pin junction is provided by a heterostructure comprising a layer of single-crystalline intrinsic semiconductor material disposed between and in electrical communication with a layer of single-crystalline p-type semiconductor material and a layer of single-crystalline n-type semiconductor material. The single-crystalline intrinsic semiconductor materials can also be made into multiple quantum well structures comprising intervening current tunneling layers, or simply epitaxially grown multiple well structures—that is, a single layer comprising multiple quantum wells can be incorporated into a heterostructure in which is it separated from its neighboring layers by current tunneling junctions.

The devices may further comprise electrodes in electrical communication with the p-type and n-type semiconductor materials and a voltage source configured to apply a voltage across the pin junction. The devices include at least one current tunneling layer disposed between the layer of single-crystalline intrinsic semiconductor material and either the layer of single-crystalline p-type semiconductor material or the layer of single-crystalline n-type semiconductor material. Some embodiments include two current tunneling layers, wherein the first current tunneling layer is disposed between the layer of single-crystalline intrinsic semiconductor material and the layer of single-crystalline p-type semiconductor material and the second current tunneling layer is disposed between the layer of single-crystalline intrinsic semiconductor material and the layer of single-crystalline n-type semiconductor material. By way of illustration, the tables in FIGS. 11(A) and 11(B) list some examples of combinations of semiconductor materials that can be used as the p-type, intrinsic and n-type single-crystalline semiconductor materials in the present pin junction lasers and light emitting diodes (FIG. 11(A)) and tandem junction solar cells (FIG. 11(B)).

An example of a device comprising a heterostructure having back-to-back heterojunctions that provides a pip energy band structure is an avalanche photodiode. Such a device may comprise a pipi-type junction comprising alternating layers of single-crystalline p-type semiconductor material and intrinsic semiconductor material. The devices may further comprise electrodes in electrical communication with the p-type and intrinsic semiconductor materials and a voltage source configured to apply a voltage across the pipi junction. The devices include at least one current tunneling layer separating at least one of the neighboring pairs of intrinsic and p-type single-crystalline semiconductor material. The table in FIG. 12 lists some examples of combinations of semiconductor materials that can be used as the p-type and intrinsic single-crystalline semiconductor materials in an avalanche photodiode having a double heterojunction with a pipi-type band structure.

The heterojunction structures can be fabricated using a combination of thin film transfer and inorganic oxide deposition techniques. Generally, a method of fabricating the heterojunction structures will comprise the steps of depositing a current tunneling layer on a pre-fabricated layer of a first single-crystalline semiconductor material and transferring a layer of a second pre-fabricated single-crystalline semiconductor material onto the current tunneling layer, whereby the current tunneling layer adheres the single-crystalline semiconductor materials together. Additional current tunneling layer deposition and single-crystalline semiconductor layer transfer steps can be carried out sequentially in order to fabricate multiple heterojunction structures. Atomic layer deposition (ALD) is a technique that can be use to deposit the inorganic materials of the current tunneling layers.

The example below provides a more detailed description of a method for fabricating a heterojunction structure. In this method, a layer of a first single-crystalline material (that can serve as the collector for an HBT) is initially provided on a substrate heterostructure and a layer of oxide is deposited on the single-crystalline material via ALD to provide a first current tunneling layer.

A layer of a second single-crystalline material (that can serve as the base for an HBT) is also initially provided on a substrate heterostructure (an SOI), wherein the single-crystalline semiconductor material is disposed on a layer of sacrificial material (the buried oxide of the SOI). The layer of sacrificial material is then selectively removed from the structure, such that the layer of the second single-crystalline semiconductor material is released. The release of the layer may be accomplished, for example, using a selective etchant or by creating a weakened plane in the material using ion implantation—a technique that is sometime referred to as Smart Cut. Optionally, the semiconductor material can be doped, either prior to or after release. Any damage caused by the doping process can be repaired using a thermal anneal. The released layer of the second single-crystalline material is then transferred onto the first current tunneling layer. The transfer can be carried out by using an intermediate host substrate or by floating the released layer in a liquid medium and then using the structure comprising the first current tunneling layer to lift the released layer out of liquid. Suitable methods for releasing thin layers of inorganic materials from epitaxial structures and for transferring the released layers to other substrate are described in U.S. Pat. No. 7,354,809. A second layer of oxide is deposited on the second single-crystalline semiconductor material via ALD to provide a second current tunneling layer.

Like the layer of the second single-crystalline semiconductor material, a layer of a third single-crystalline semiconductor material (that can serve as the base for an HBT) is initially provided on a substrate heterostructure, wherein the single-crystalline semiconductor material is disposed on a layer of sacrificial material. The layer of sacrificial material is then selectively removed from the structure, such that the layer of the third single-crystalline semiconductor material is released. Optionally, the semiconductor material can doped, either prior to or after release. Any damage caused by the doping process can be repaired using a thermal anneal. The released layer of the third single-crystalline material is then transferred onto the second current tunneling layer. The resulting structure comprises a two back-to-back three-layered heterojunctions.

EXAMPLE

This example describes the fabrication of a back-to-back heterojunction structure for the HBT device of FIGS. 3 and 4.

In this fabrication scheme, a collector layer comprising n-type GaAs, a base layer comprising p-type Si and an emitter layer comprising n-type GaAs were each fabricated separately before being incorporated into the vertical HBT structure.

To form the GaAs collector, a GaInP/GaAs/GaAs npn-type HBT was obtained from Kopin/Skyworks. The HBT was initially a 9-layered structure, as shown in FIG. 13. Layers 1-5 were removed leaving a 4-layered collector stack (layers 6-9 in FIG. 13; corresponding to reference numbers 1412-1418, respectively in FIG. 14) comprising a GaAs substrate (layer 9 in FIG. 13), an n-type GaAs sub-collector (layer 8 in FIG. 13), and an n-type GaAs collector (layers 6 and 7 in FIG. 13). (It should be noted that, in this experiment, a pre-fabricated HBT was used as a starting substrate for purposes of convenience. One could, of course, also simply grow a GaAs collector layer over a GaAs subcollector for use as the starting substrate.)

A 2 nm thick layer of $Al_2O_3$ was then deposited onto the n-type GaAs collector of the collector stack via atomic layer deposition using a standard ALD set-up to provide a first oxide current tunneling layer. The ALD cycle for $Al_2O_3$ deposition consisted of two self-terminating half-cycle reactions (shown below). In the first half-cycle, the precursor molecule was supplied into the deposition chamber. In this reaction, the precursor molecule adsorbed on the substrate forming covalent bonds with the surface molecules. In the second half-cycle, the reactant molecule was supplied into the deposition chamber.

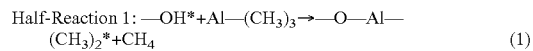

Half-Reaction 1: —OH*+Al—$(CH_3)_3$→—O—Al—$(CH_3)_2$*+$CH_4$ (1)

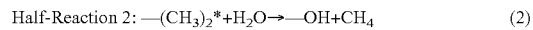

Half-Reaction 2: —$(CH_3)_2$*+$H_2O$→—OH+$CH_4$ (2)

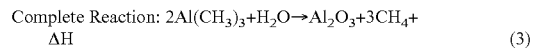

Complete Reaction: $2Al(CH_3)_3+H_2O→Al_2O_3+3CH_4+ΔH$ (3)

Figure 14:
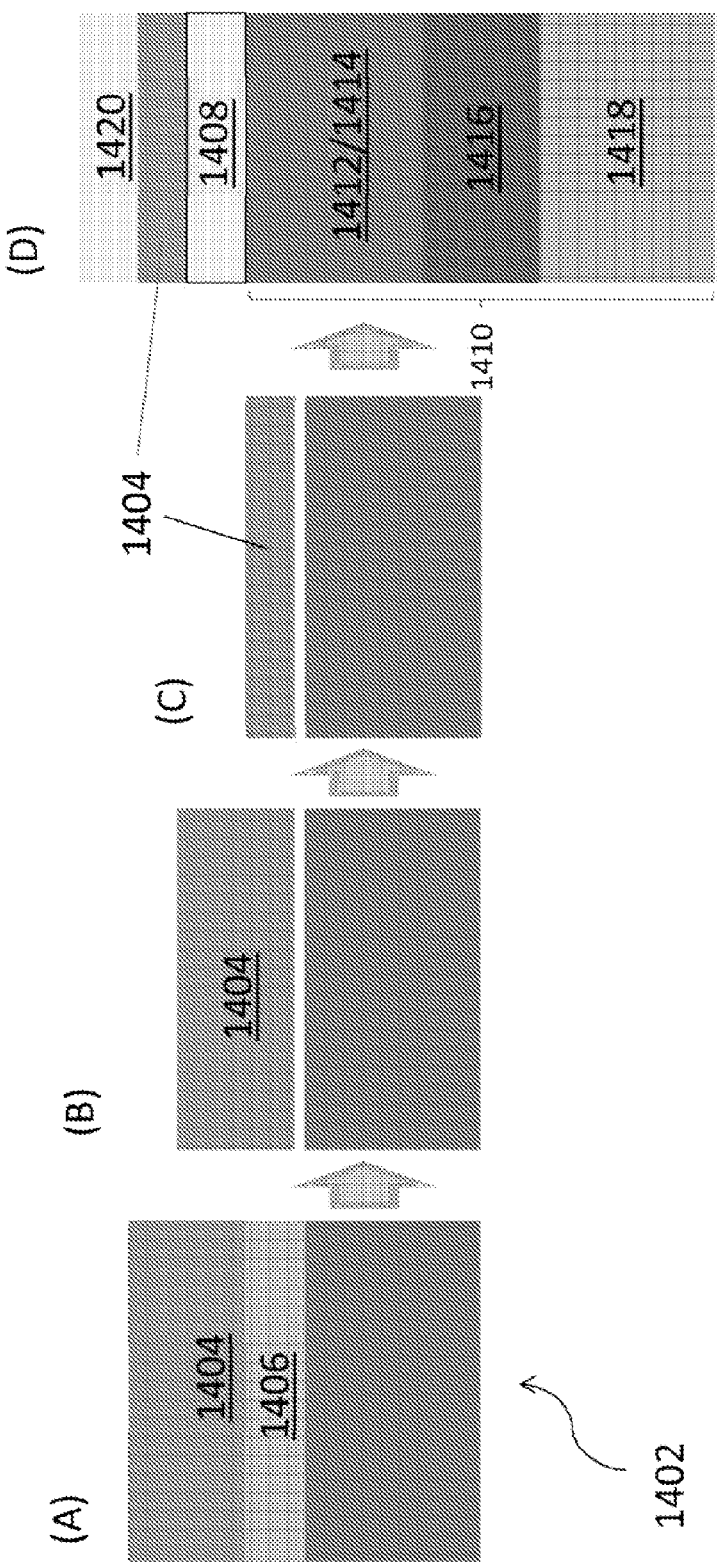
FIG. 14 is a schematic diagram illustrating the process of fabricating a layer of single-crystalline material as an HBT base layer and transferring that layer onto a current tunneling layer that has been deposited on a collector, as described in the Example.

The method for forming the Si base layer is illustrated schematically in FIG. 14. To form the Si emitter, a commercially available silicon-on-insulator (SOI) substrate 1402 was obtained. The Si device layer 1404 of the SOI was doped with boron to a dopant concentration of ~$10^{20}$ $cm^{-3}$ (FIG. 14, panel A). Doping of the device layer of the SOI was accomplished using conventional ion-implantation methods. Suitable dopants include B, $BF_2$, Ga for p-type doping and P. As for n-type doping. An annealing procedure at a temperature of about 850-950° C. for 10-20 min. is applied post-doping. The buried silicon dioxide (BOX) layer 1406 of SOI 1402 was then etched away to release doped Si layer 1404 (FIG. 14, panel B). Hydrogen fluoride is a recommended etchant because $SiO_2$ has very good etching selectivity in hydrogen fluoride (HF) over Si. Therefore, the thin Si layer can be formed by undercutting by submerging the patterned SOI wafer in HF until the Si device layer is released. The released Si layer, then gently settles onto the handling substrate.

Released Si layer 1404 was then thinned to a thickness of 50 nm (FIG. 14, panel C). Thinning can be carried out using thermal oxidation. During thermal oxidation, 46% of the Si is usually consumed, therefore, the thickness of device layer can be precisely controlled. The resulting thermal oxide can then be dissolved in HF. Finally, the thinned, released Si layer was transferred onto $Al_2O_3$ layer 1408 on collector stack 1410 (FIG. 14, panel D). The released layer can be picked up and transferred using an elastomeric stamp (made with PDMS (Polydimethylsiloxane)).

A 1 nm thick layer of $Al_2O_3$ 1420 was then deposited onto the p-type Si base via atomic layer deposition to provide a second oxide current tunneling layer, using the process described above.

Figure 15:
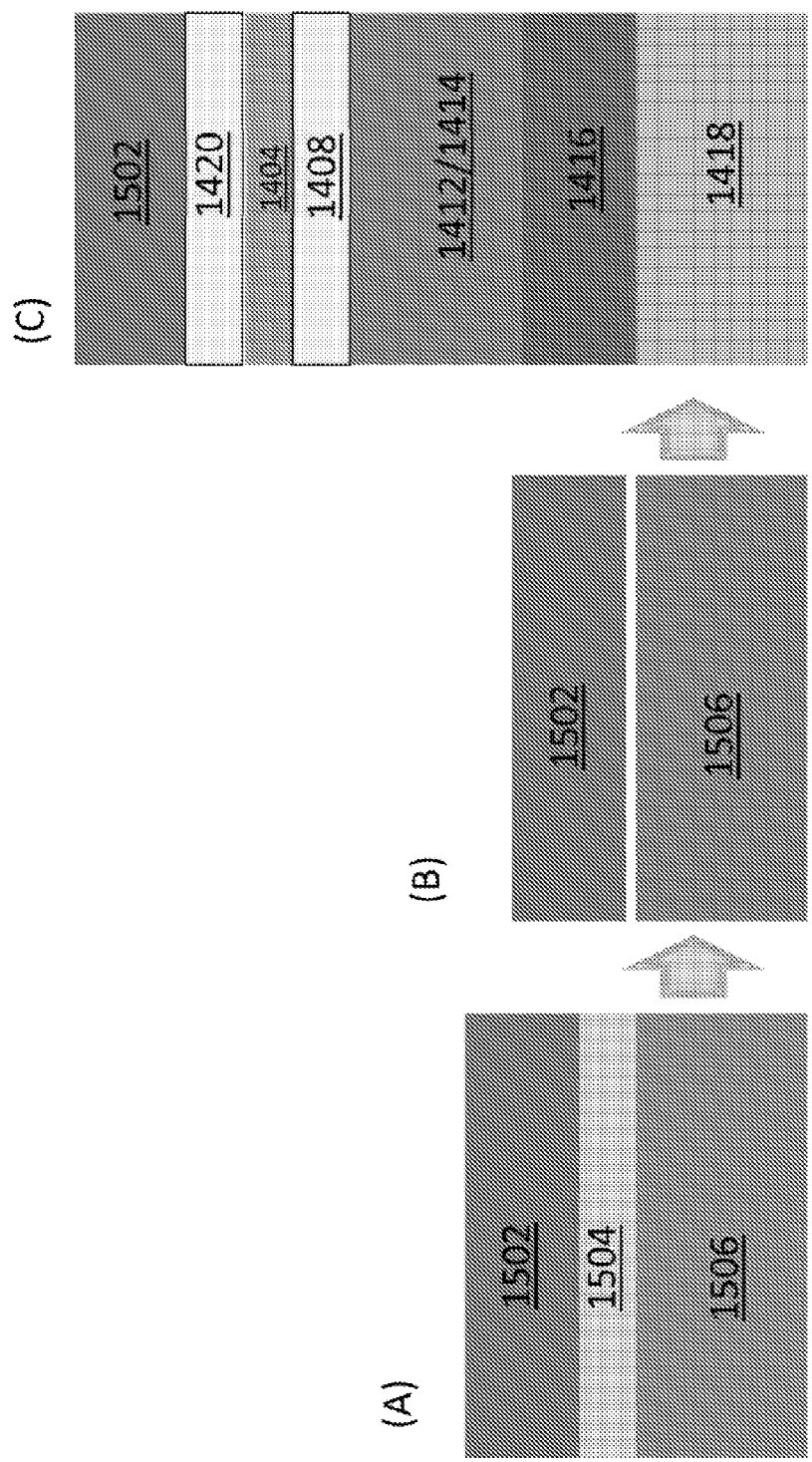
FIG. 15 is a schematic diagram illustrating the process of fabricating a layer of single-crystalline material as an HBT emitter layer and transferring that layer onto a current tunneling layer that has been deposited on a base, as described in the Example.

A method of forming the n-type GaAs emitter layer is illustrated schematically in FIG. 15. The process began with a pre-fabricated, tri-layered semiconductor heterostructure comprising a layer of single-crystalline n-type GaAs 1502 on a sacrificial layer of AlGaAs 1504 that is disposed on a GaAs substrate 1506 (FIG. 15, panel A). (To make the structure, the GaAs/AlGaAs epi layers were epitaxially grown by MOCVD on a GaAs substrate.) The dopant concentration and thickness of each layer in the initial structure is provided in FIG. 16, wherein layer numbers 3 and 4 correspond to reference numbers 1502 in FIG. 15 and layer numbers 1 and 2 correspond to reference numbers 1506 and 1504, respectively.

Sacrificial layer 1504 was then etched away to release layer 1502 which would serve are the emitter of the HBT (FIG. 15, panel B). The etching selectivity of $Al_{0.95}Ga_{0.05}As$ over GaAs is about 10,000 times when the Al in the composite is 0.95. Therefore, AlGaAs can be wet-etched by hydrogen fluoride (HF), while the GaAs layer remains undamaged and is, thereby released from the structure. Released emitter layer 1504 was then transferred onto $Al_2O_3$ layer 1420 (FIG. 15, panel C).

The performance properties of the resulting HBT were characterized and the results are presented in the graphs of FIG. 17(A)-(E). FIG. 17(A) shows the collector current as a function of Vce voltage: FIG. 17(B) shows the current gain (beta) as a function of Vbe; FIG. 17(C) shows the current gain as a function of Vbe at two different temperatures; FIG. 17(D) shows the gain as a function of frequency; and FIG. 17(E)

shows the base current and collector current as a function of Vbe. For the DC measurements, the HBT was measured using a HP 4155B semiconductor parameter analyzer and for the RF measurements, HBT was measured using the Agilent E8364A performance network analyzer.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A semiconductor heterojunction structure comprising:
   a layer of a first single-crystalline semiconductor material;
   a layer of a second single-crystalline semiconductor material, the second single-crystalline semiconductor material having a different chemical composition and a different lattice constant than the first single-crystalline semiconductor material; and
   a current tunneling layer disposed between and in contact with the upper surface of the layer of the first single-crystalline semiconductor material and the lower surface of the layer of the second single-crystalline semiconductor material, wherein the current tunneling layer comprises an inorganic material, wherein the bandgap of the inorganic material is wider than the bandgaps of the first and second single-crystalline semiconductor materials and further wherein the inorganic material is not a native oxide of the first single-crystalline semiconductor material or a native oxide of the second single-crystalline semiconductor material;
   wherein the interfaces between the current tunneling layer and the layers of the first and second single-crystalline semiconductor materials do not have an epitaxial structure.

2. The semiconductor heterojunction structure of claim 1, wherein the semiconductor materials of the first and second layers of single-crystalline semiconductor material have a lattice constant mismatch of at least 2%.

3. The semiconductor heterojunction structure of claim 1, wherein the inorganic material is an oxide of a metal element, an oxide of a semiconductor element or an oxide of a metalloid element.

4. The semiconductor heterojunction structure of claim 1, wherein the inorganic material is aluminum oxide.

5. The semiconductor heterojunction structure of claim 4, wherein the current tunneling layer has an average thickness of no greater than 5 nm.

6. The semiconductor heterojunction structure of claim 1, wherein the inorganic material is a nitride of a metal element, a nitride of a semiconductor element or a nitride of a metalloid element.

7. The semiconductor heterojunction structure of claim 1, wherein the first and second single-crystalline semiconductor materials have a coefficient of thermal expansion mismatch of at least 200%.

8. The semiconductor heterojunction structure of claim 1, wherein the lower surface of the layer of the first single-crystalline semiconductor material and the upper surface of the layer of the second single-crystalline semiconductor material have an rms roughness of at least 2 nm.

9. The semiconductor heterojunction structure of claim 1, wherein one of the first and second single-crystalline materials is diamond.

10. The semiconductor heterojunction structure of claim 9, wherein the inorganic material is aluminum oxide.

11. The semiconductor heterojunction structure of claim 9, wherein the other of the first and second single-crystalline materials is a different Group IV semiconductor, a Group III-V semiconductor or a Group II-VI semiconductor.

12. The semiconductor heterojunction structure of claim 1, wherein one of the first and second single-crystalline materials is a Group IV semiconductor and the other of the first and second single-crystalline semiconductor materials is a Group III-V semiconductor or a Group II-VI semiconductor.

13. The semiconductor heterojunction structure of claim 1, wherein the first single-crystalline semiconductor material is p-type doped and the second single-crystalline semiconductor material is n-type doped; and wherein the structure further comprises a first electrical contact in electrical communication with the layer of the first single-crystalline semiconductor material and a second electrical contact in electrical communication with the layer of the second single-crystalline semiconductor material, such the structure provides a PN diode.

14. The semiconductor heterojunction structure of claim 1, further comprising a layer of a third single-crystalline semiconductor material disposed on the upper surface of the layer of the second single-crystalline semiconductor material, wherein the layer of the first single-crystalline semiconductor material, the layer of the second single-crystalline semiconductor material and the layer of the third single-crystalline semiconductor material form an npn-type band structure or a pnp-type band structure.

15. The semiconductor heterojunction structure of claim 14, wherein the first semiconductor material is p-type doped diamond, the second semiconductor material is n-type doped silicon, the third semiconductor material is p-type doped silicon and the inorganic material is aluminum oxide.

16. The semiconductor heterojunction structure of claim 14, wherein the first semiconductor material is p-type doped diamond, the second semiconductor material is n-type doped germanium, the third semiconductor material is p-type doped silicon and the inorganic material is aluminum oxide.

17. The semiconductor heterojunction structure of claim 14, wherein the first semiconductor material is n-type doped GaN, the second semiconductor material is p-type doped silicon, the third semiconductor material is n-type doped silicon and the inorganic material is aluminum oxide.

18. The semiconductor heterojunction structure of claim 14, wherein the first semiconductor material is n-type doped GaN, the second semiconductor material is p-type doped germanium, the third semiconductor material is n-type doped silicon and the inorganic material is aluminum oxide.

19. The semiconductor heterojunction structure of claim 1, further comprising:

a layer of a third single-crystalline semiconductor material having a different chemical composition and a different lattice constant than the second single-crystalline semiconductor material; and a second current tunneling layer, disposed between and in contact with the upper surface of the layer of the second single-crystalline semiconductor material and the lower surface of the layer of the third single-crystalline semiconductor material, wherein the second current tunneling layer comprises an inorganic material, wherein the bandgap of the inorganic material of the second current tunneling layer is wider that the bandgaps of the second and third single-crystalline semiconductor materials, and further wherein the inorganic material is not a native oxide of the second single-crystalline semiconductor material or a native oxide of the third single-crystalline semiconductor material;

wherein the interfaces between the second current tunneling layer and the layers of the second and third single-crystalline semiconductor materials do not have an epitaxial structure.

20. The semiconductor heterojunction structure of claim 18, wherein the layer of the first single-crystalline semiconductor material, the layer of the second single-crystalline semiconductor material and the layer of the third single-crystalline semiconductor material form a pnp-type band structure, an npn-type band structure, a pin-type band structure or a pipi-type band structure or a pin-pin-pin type band structure.

21. The semiconductor heterojunction structure of claim 1, wherein the current tunneling layer comprises at least two sub-layers, each sub-layer comprising an inorganic material, wherein the bandgaps of the inorganic materials are wider that the bandgaps of the first and second single-crystalline semiconductor materials and further wherein the inorganic materials are not native oxides of the first single-crystalline semiconductor material or native oxides of the second single-crystalline semiconductor material.

22. A heterobipolar transistor comprising:

a collector comprising a layer of a first single-crystalline semiconductor material;

a base comprising a layer of a second single-crystalline semiconductor material, the second single-crystalline semiconductor material having a different chemical composition and a different lattice constant than the first single-crystalline semiconductor material;

a current tunneling layer disposed between and in contact with the upper surface of the layer of the first single-crystalline semiconductor material and the lower surface of the layer of the second single-crystalline semiconductor material, wherein the current tunneling layer comprises an inorganic material, wherein the bandgap of the inorganic material is wider than the bandgaps of the first and second single-crystalline semiconductor materials and further wherein the inorganic material is not a native oxide of the first single-crystalline semiconductor material or a native oxide of the second single-crystalline semiconductor material; and an emitter comprising a layer of a third single-crystalline semiconductor material.

* * * * *

UNITED STATES PATENT AND TRADEMARK OFFICE
CERTIFICATE OF CORRECTION

| | | |
|---|---|---|
| PATENT NO. | : 8,866,154 B2 | Page 1 of 1 |
| APPLICATION NO. | : 13/831449 | |
| DATED | : October 21, 2014 | |
| INVENTOR(S) | : Zhenqiang Ma et al. | |

It is certified that error appears in the above-identified patent and that said Letters Patent is hereby corrected as shown below:

ON THE TITLE PAGE
UNDER ABSTRACT

"22 Claims, 16 Drawing Sheets" should read --22 Claims, 15 Drawing Sheets--

IN THE DRAWINGS
Sheet 15 of 16

Figure 17:
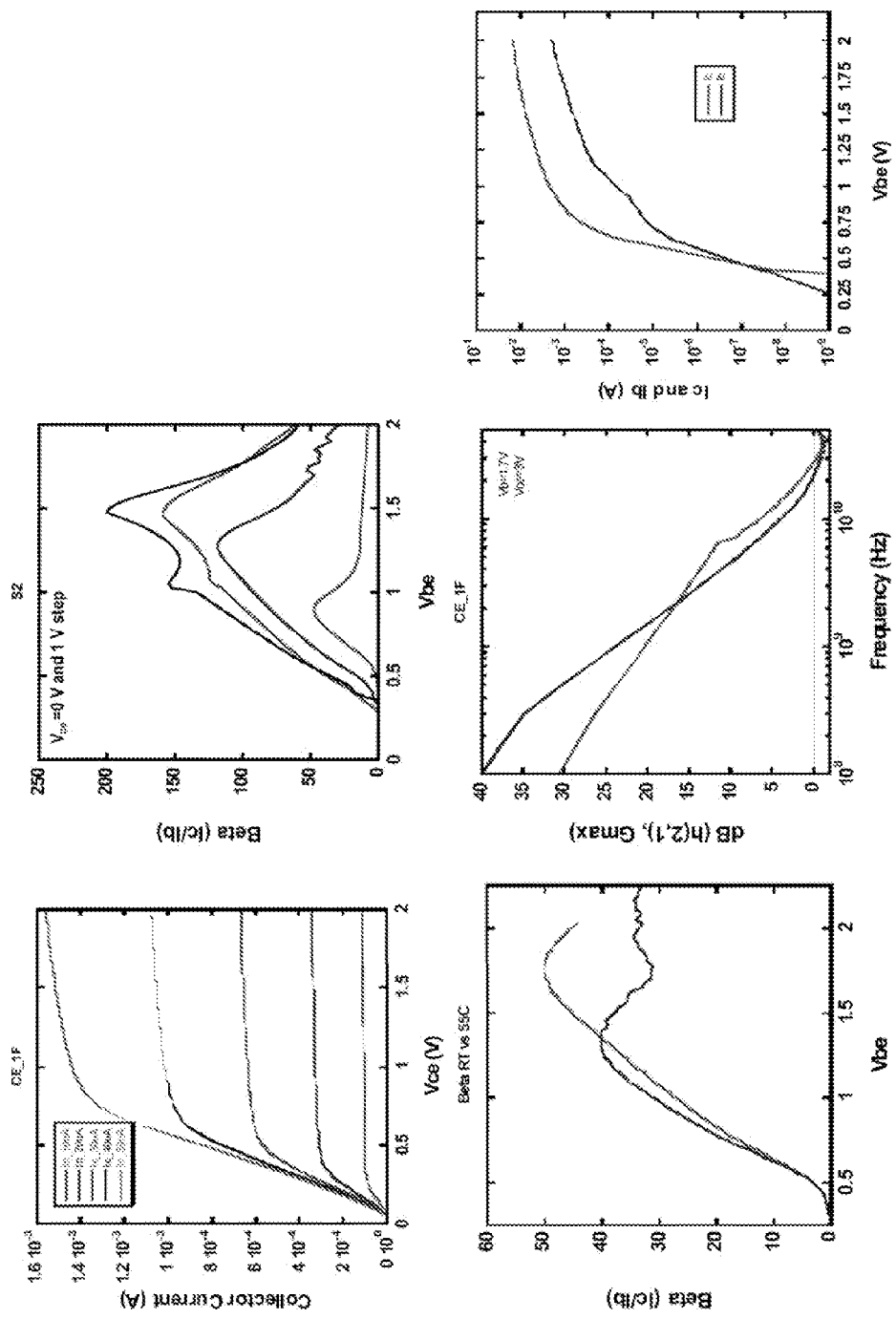
FIGS. 17(A)-(E) are graphs showing the performance characteristics of the HBT of the Example.

Delete FIG. 17

IN THE CLAIMS
Col. 15, Line 12 (claim 19)

Delete "that the bandgaps" and replace with --than the bandgaps--

Col. 16, Line 3 (claim 21)

Delete "that the bandgaps" and replace with --than the bandgaps--

Signed and Sealed this
Twenty-eighth Day of July, 2015

Michelle K. Lee
*Director of the United States Patent and Trademark Office*